United States Patent
Pal

(10) Patent No.: US 9,918,406 B2
(45) Date of Patent: Mar. 13, 2018

(54) MOUNTING ARRANGEMENTS FOR ELECTRICAL CONTACTORS

(71) Applicant: Hamilton Sundstrand Corporation, Charlotte, NC (US)

(72) Inventor: Debabrata Pal, Hoffman Estates, IL (US)

(73) Assignee: Hamilton Sundstrand Corporation, Charlotte, NC (US)

(*) Notice: Subject to any disclaimer, the term of this patent is extended or adjusted under 35 U.S.C. 154(b) by 0 days.

(21) Appl. No.: 15/208,204

(22) Filed: Jul. 12, 2016

(65) Prior Publication Data

US 2018/0020574 A1    Jan. 18, 2018

(51) Int. Cl.
*H05K 7/20*    (2006.01)
*H02B 1/015*    (2006.01)

(52) U.S. Cl.
CPC ......... *H05K 7/20509* (2013.01); *H02B 1/015* (2013.01)

(58) Field of Classification Search
CPC . G06F 1/181–1/182; H05K 7/20218–7/20381; H05K 7/20409–7/20418; H05K 7/20009–7/202; H01L 23/367–23/3677; H01L 23/46–23/467
USPC ...... 361/676–678, 679.46–679.54, 688–723; 165/80.1–80.5, 104.33, 185; 174/15.1–15.3, 16.1–16.3, 547, 548; 257/712–722, E23.088; 24/453, 458–459; 454/184; 312/236
See application file for complete search history.

(56) References Cited

U.S. PATENT DOCUMENTS

| 2,420,449 | A | | 5/1947 | Somes | |
|---|---|---|---|---|---|
| 3,921,201 | A | * | 11/1975 | Eisele | H01L 23/427 165/80.4 |
| 4,060,847 | A | * | 11/1977 | Penrod | H01H 50/12 174/16.3 |
| 5,541,561 | A | * | 7/1996 | Grunert | H01H 9/42 335/132 |
| 5,795,183 | A | * | 8/1998 | Kameyama | H01R 13/703 439/528 |
| 5,909,019 | A | * | 6/1999 | Maloney | H01H 9/282 200/43.14 |
| 5,914,664 | A | * | 6/1999 | Scheele | H01H 50/545 250/208.4 |

(Continued)

FOREIGN PATENT DOCUMENTS

DE    3878936 T2    6/1993
EP    2680289 A1    1/2014

OTHER PUBLICATIONS

Extended European Search Report received from European Patent Office (EPO) dated Dec. 20, 2017 for Application No. EP17180701.9.

*Primary Examiner* — Anthony Haughton
*Assistant Examiner* — Razmeen Gafur
(74) *Attorney, Agent, or Firm* — Locke Lord LLP; Scott D. Wofsy; Christopher J. Cillié

(57) ABSTRACT

A mounting arrangement for an electrical contactor includes a panel and a post. The post has a first end and a second end protruding from the panel. The first end of the post is arranged to electrically communicate with an electrical contactor. The second end of the post is arranged to connect to an electrical bus bar. A cold plate overlays the panel, extends about the post, and is in thermal communication with the post to transfer heat between the cold plate and post.

17 Claims, 4 Drawing Sheets

(56) References Cited

U.S. PATENT DOCUMENTS

| | | | | |
|---|---|---|---|---|
| 6,249,435 B1* | 6/2001 | Vicente | H05K 7/20909 | 165/185 |
| 6,493,202 B2* | 12/2002 | Kappel | H01H 50/30 | 361/152 |
| 6,624,990 B1* | 9/2003 | Lortscher | H01H 9/04 | 361/42 |
| 7,286,036 B2* | 10/2007 | Marquardt | H01F 5/04 | 336/147 |
| 7,790,994 B2* | 9/2010 | Mason | H02B 11/127 | 200/50.21 |
| 8,957,334 B1* | 2/2015 | Bullock | H02B 1/36 | 200/50.26 |
| 2002/0011470 A1* | 1/2002 | Domschot | B23K 11/115 | 219/86.8 |
| 2004/0022034 A1* | 2/2004 | Coles | H05K 7/1409 | 361/726 |
| 2005/0212631 A1* | 9/2005 | Marquardt | H01F 5/04 | 335/132 |
| 2007/0173133 A1* | 7/2007 | Carlson | H01R 13/6335 | 439/709 |
| 2008/0062638 A1* | 3/2008 | Cohen | B81C 3/002 | 361/689 |
| 2008/0074217 A1* | 3/2008 | Duchrow | H01H 9/342 | 335/202 |
| 2008/0094782 A1* | 4/2008 | Mason | H02B 11/127 | 361/609 |
| 2012/0285950 A1* | 11/2012 | Guering | H02B 1/044 | 220/3.2 |
| 2013/0009464 A1* | 1/2013 | Firehammer | H01M 10/425 | 307/9.1 |
| 2013/0192798 A1* | 8/2013 | Sharaf | F28D 7/00 | 165/104.33 |
| 2014/0126158 A1* | 5/2014 | Baran | H01H 71/08 | 361/729 |
| 2014/0133109 A1* | 5/2014 | Thomasson | H01H 50/02 | 361/752 |
| 2015/0194797 A1* | 7/2015 | Horowy | H02G 5/10 | 174/70 B |

* cited by examiner

MOUNTING ARRANGEMENTS FOR ELECTRICAL CONTACTORS

BACKGROUND OF THE INVENTION

1. Field of the Invention

The present disclosure relates to electrical systems, and more particularly to mounting arrangements for contactors in power distribution systems.

2. Description of Related Art

Contactors are commonly used in electrical systems, such as aircraft power distribution systems, to control the flow of power and current between power sources and power-consuming devices. Contactors generally have an electrically open and an electrically closed state, contactors allowing power and current to flow through the contactor when in the electrically closed state, and preventing when in the electrically open state. Contactor state is typically changed by mechanically actuating a contact plate within the contactor. When current flow is required the contact plate is pushed into electrical contact with two leads, thereby forming an electrical path extending through the contactor and allowing current and power flow. When current flows through the contactor, current carrying-components typically generate heat due to resistive heating of current-carrying components. The heat typically dissipates to the external environment via natural convection from the contactor and surrounding structures. In some electrical systems, current flow through the contactor can be such that heat transfer to the ambient environment is inadequate, potentially leading to increased contactor temperature and/or potentially reducing the expected service life of the contactor.

Such conventional methods and systems have generally been considered satisfactory for their intended purpose. However, there is still a need in the art for improved electrical contactor assemblies and panel assemblies. The present disclosure provides a solution for this need.

SUMMARY OF THE INVENTION

A mounting arrangement for an electrical contactor includes a panel and a post. The post has a first end and a second end protruding from the panel. The first end of the post is arranged to electrically communicate with an electrical contactor. The second end of the post is arranged to connect to an electrical bus bar. A cold plate overlaying the panel, extends about the post, and is in thermal communication with the post to transfer heat between the cold plate and post.

In certain embodiments, the cold plate can include an electrically conductive material. The cold plate can define a post aperture. The post can extend through the post aperture. The post can be separated from the cold plate by the post aperture. The cold plate can define a fastener aperture. The fastener aperture can be laterally offset from the post. The fastener aperture can overlay the panel. A fastener can extend through the fastener aperture. The fastener can couple the post to the panel. The fastener can be separated from the cold plate by the fastener aperture.

In accordance with certain embodiments, the cold plate can have an inlet, an outlet, and can define within its interior a coolant channel. One or more of the inlet, the outlet, and the coolant channel can overlay the panel. The coolant channel can be laterally offset from the post. The coolant channel can be a first coolant channel and the cold plate can define a second coolant channel. The second coolant channel can overlay the panel. The second coolant channel can be laterally offset from the post on a side of the post opposite the first coolant channel. The first and second coolant channels can be disposed on laterally opposite sides of the post.

It is also contemplated that, in accordance with certain embodiments, the mounting arrangement can include an electrically insulating body. The electrically insulating body can include an electrically insulating material with high thermal conductivity, such as aluminum nitride. The electrically insulating body can overlay the cold plate. The electrically insulating body can electrically isolate the cold plate from the post. The cold plate can be in thermal communication with the post through the electrically insulating body. The electrically insulating body can extend laterally from the post on laterally opposite sides of the post. The post can include a mounting flange, and the mounting flange can overlay the electrically insulating body.

It is further contemplated the mounting arrangement can include a panel mounting structure. The panel mounting can be disposed between the cold plate and the panel. The panel mounting structure can extend laterally beyond the cold plate on opposite sides of the post. The panel mounting structure can include as electrically insulating material, such as a glass-reinforced epoxy laminate sheet material. An electrical contactor can be in electrical communication with the post. The contactor can be disposed on a side of the cold plate opposite the panel. A bus bar can be connected to the post. The bus bar can be disposed on a side of the panel opposite the cold plate.

An electrical panel assembly includes a panel, a post having a first end and a second end protruding from the panel, the second end configured to connect to an electrical bus bar, and an electrical contactor in electrical communication with the first end of the post. A bus bar is connected to the post. A cold plate extends about the post, overlays the panel and is in thermal communication the post. An electrically insulating body overlays the cold plate, electrically separates the cold plate from the post, and thermally couples the cold plate with the post.

These and other features of the systems and methods of the subject disclosure will become more readily apparent to those skilled in the art from the following detailed description of the preferred embodiments taken in conjunction with the drawings.

BRIEF DESCRIPTION OF THE DRAWINGS

So that those skilled in the art to which the subject disclosure appertains will readily understand how to make and use the devices and methods of the subject disclosure without undue experimentation, embodiments thereof will be described in detail herein below with reference to certain figures, wherein.

DETAILED DESCRIPTION OF THE PREFERRED EMBODIMENTS

Figure 1:
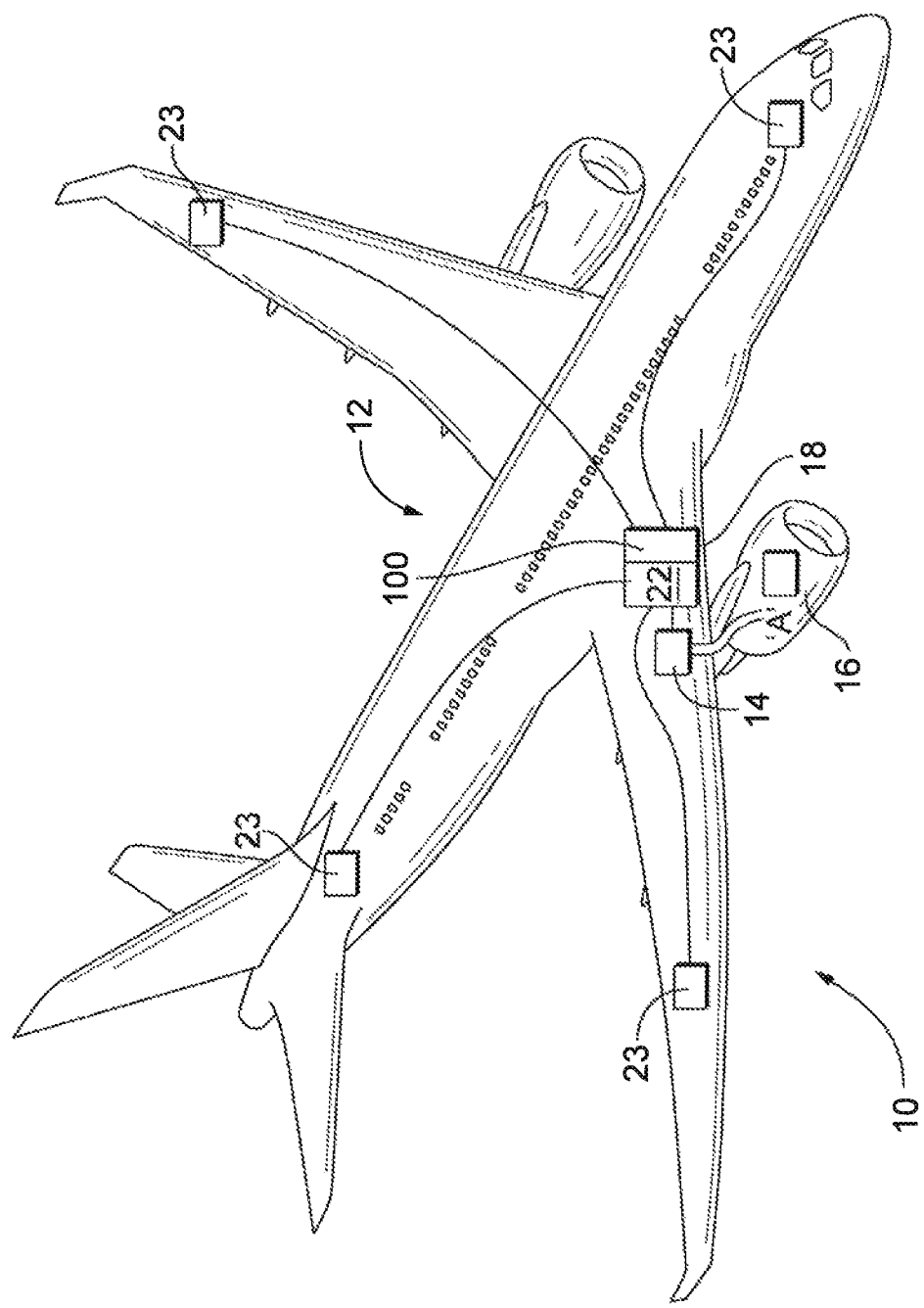
FIG. 1 is a schematic view of an exemplary embodiment of an aircraft electrical system constructed in accordance with the present disclosure, showing an electrical panel box assembly and an electrical contactor assembly.

Reference will now be made to the drawings wherein like reference numerals identify similar structural features or aspects of the subject disclosure. For purposes of explanation and illustration, and not limitation, a partial view of an exemplary embodiment of mounting arrangements for an electrical contactor assembly in accordance with the disclosure is shown in FIG. 1 and is designated generally by reference character 100. Other embodiments of mounting arrangements for electrical contactors, electrical contactor assemblies, and electrical panel assemblies in accordance with the disclosure, or aspects thereof, are provided in FIGS. 2-4, as will be described. The systems and methods described herein can be used removing heat from electrical contactor assemblies, such as in electrical panel box assemblies in aircraft electrical systems.

Referring now to FIG. 1, an aircraft 10 is shown. Aircraft 10 includes an electrical power distribution system 12. Electrical power distribution system 12 includes a power generation system 14, which uses mechanical rotation of a gas turbine engine 16 to generate either single phase or multi-phase electrical power A. Electrical power A is provided by electrical power distribution system 12 to a panel box assembly 18. Panel box assembly 18 houses bus bars 20 (shown in FIG. 2) and one or more electrical contactor assembly 22 mounted in panel box assembly 18 by a mounting arrangement 100. Electrical contactor assembly 22 is configured and adapted for controlling the flow of electrical power and current between power generation system 14 and power consuming devices 23 connected to panel box assembly 18.

Figure 2:
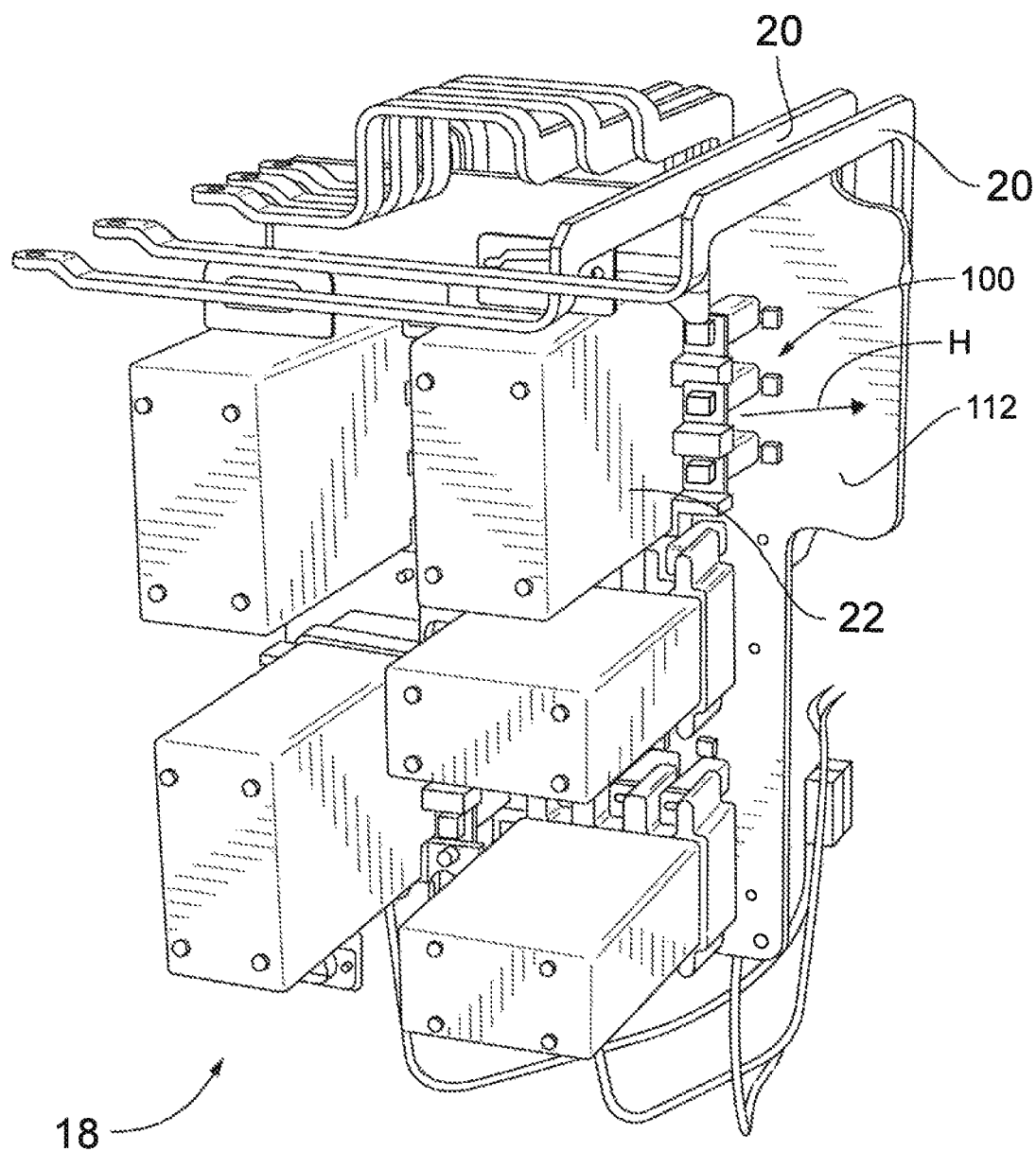
FIG. 2 is a perspective view of the panel box assembly of FIG. 1, showing the electrical contactor assembly in electrical communication with a bus bar.

With reference to FIG. 2, an interior portion of panel box assembly 18 is shown. Panel box assembly 18 includes bus bars 20, electrical contactor assembly 22, and mounting arrangement 100 mounting electrical contactor assembly 22 to bus bars 20 within panel box assembly 18 to a panel 112. Bus bars 20 are interrupted by the one or more electrical contactor assembly 22, which have an electrically-closed state and an electrically-open state. When in the electrically-open state no current flows through electrical contactor assembly 22 and between bus bras 20. When in the electrically-closed state, current flows between bus bars 20 through electrical contactor assembly 22. The flow of electrical current through electrical contactor assembly 22 generates heat H from resistive heating. It is to be understood and appreciated that panel box assembly 18 can be single phase power panel or a multiphase power panel, such as a two-phase or three-phase power panel. Although illustrated as a mechanical contactor arrangement, it is to be understood and appreciated that present disclosure can also be advantageous to solid-state switch arrangements.

Figure 3:
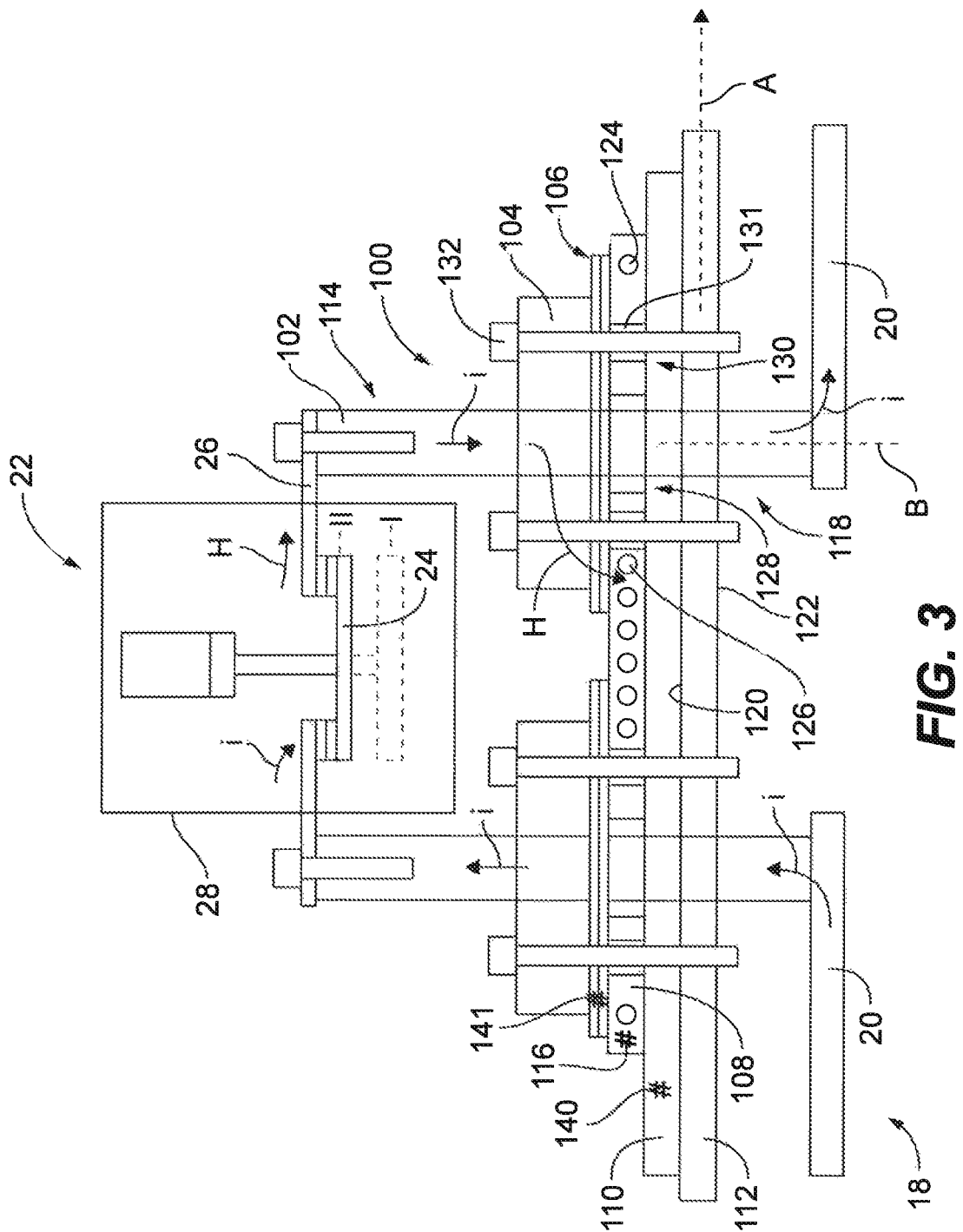
FIG. 3 is a schematic cross-sectional view of the electrical panel box assembly and electrical contactor assembly of FIG. 1, showing current flow and heat flow through components of the electrical panel box assembly and electrical contactor assembly.

With reference to FIG. 3, panel box assembly 18 is shown. Panel box assembly 18 includes an electrical contactor assembly 22. Electrical contactor assembly 22 is mounted within panel box assembly 18 by mounting arrangement 100. In the illustrated exemplary embodiment electrical contactor assembly 22 includes a contactor element 24 movable between a first position (shown in dashed outline), wherein electrical contactor assembly 22 is electrically-open, and a second position II (shown in solid outline), wherein contactor element 24 is electrically closed. As will be appreciated by those of skill in the art in view of the present disclosure, when in the second position, current i flows through contactor element 24 when in second position II. Current flow I generates heat H by resistive heating of contactor element 24 and other current-carrying components of electrical contactor assembly 22 convey current i. Heat H and current i flow through leads 26, which extend through a housing 28 of electrical contactor assembly 22.

Mounting arrangement 100 includes a post 102 with a mounting flange 104, an electrically insulating body 106, a cold plate 108, a panel mounting structure 110, and panel 112. Post 102 has a first end 114 and a second end 118. First end 114 protrudes from a first surface 120 of panel 112 and is in electrical communication with electrical contactor assembly 22. Second end 118 protrudes from a second surface of 122 of panel 112 and is connected to bus bar 20. Between first surface 120 and opposed second surface 122 of panel 112 defines a panel axis A. Panel axis A is angled relative to a post axis B defined by post 102, post axis B being substantially orthogonal relative to panel axis A in the illustrated exemplary embodiment.

Cold plate 108 overlays panel 112, extends about post 102, and is in thermal communication with post 102 for transferring heat H between cold plate 108 and post 102. Cold plate 108 is formed from an electrically conductive material 116, such as aluminum and/or alloys thereof, by way of non-limiting example. As will be appreciated by those of skill in the art in view of the present disclosure, such materials are relatively easy to work, which make it possible to define a coolant manifold 142 (shown in FIG. 4) within cold plate 108 within a relatively thin plate-like body of cold plate 108. This allows electrical panel box assembly 18 to be relatively compact and lightweight.

Figure 4:
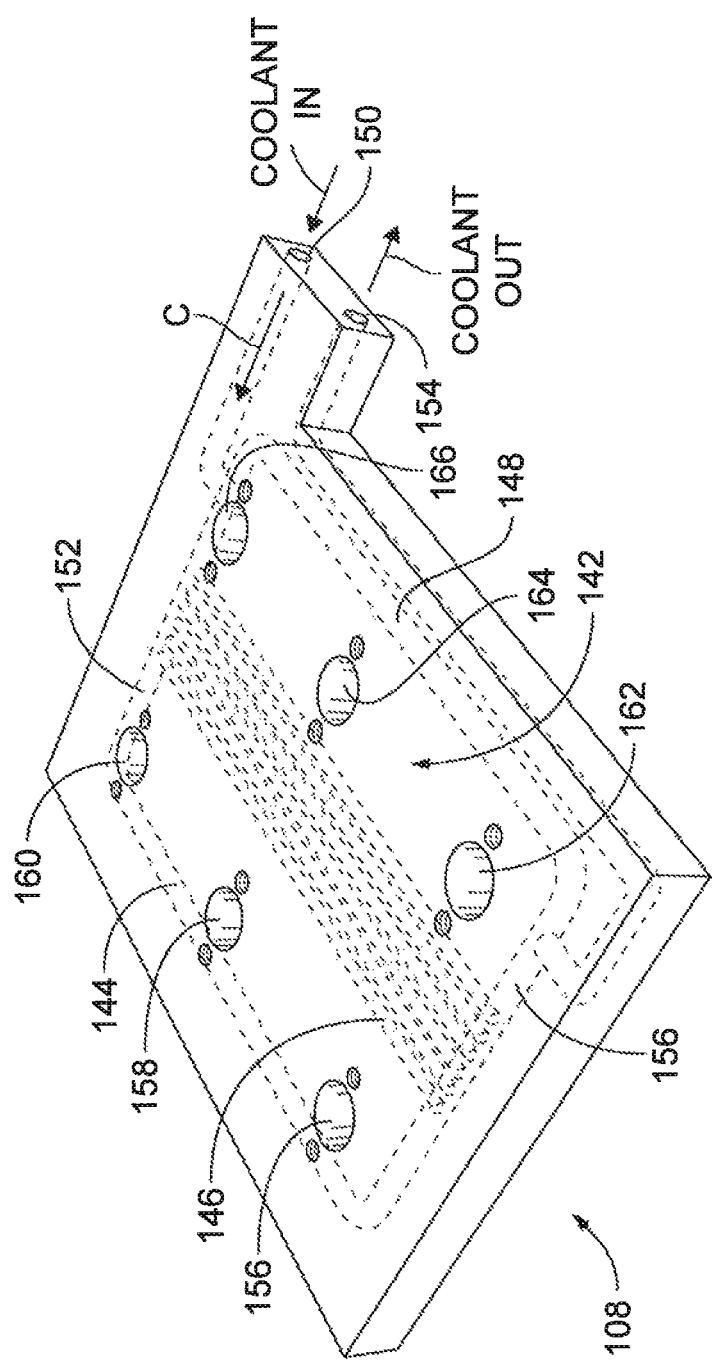
FIG. 4 is a perspective view of the cold plate of FIG. 3, showing post apertures for electrically separating the contactor posts from the cold plate and fastener apertures for placing the posts in thermal communication with the contactor assembly.

In the illustrated exemplary embodiment cold plate 108 defines a plurality of coolant channels, e.g., a first coolant channel 124 and a second coolant channel 126, within its interior that are in fluid communication with a coolant inlet 150 (shown in FIG. 4) and a coolant outlet 154 (shown in FIG. 4). First coolant channel 124 defined within cold plate 108 overlays panel 112 and is laterally offset from post 102. Second coolant channel 126 is defined within cold plate 108, overlays panel 112, and is laterally offset from post 102 on a side of post 102 opposite first coolant channel 124. This arrangement allows for drawing heat laterally (relative to post axis B) from post 102 from both sides of post 102 through mounting flange 104, increasing heat transfer from post 102.

Cold plate 108 defines a post aperture 128. Post aperture 128 overlays panel 112 and is arranged axially along post axis B between mounting flange 104 and panel 102. Post 102 extends through post aperture 128 between lead 26 and bus bar 20. Post aperture 128 has a width that is greater than a width of post 102, a gap 131 thereby being defined between cold plate 108 and post 102. The gap provides electrical separation between post 102 and cold plate 108, enable post 102 to conduct electrical current without cold plate 108, which spans the posts of electrical contactor assembly 22, without short circuiting current flowing through the posts with the conductive material forming cold plate 108. It is contemplated that post aperture 128 be sized such that radiant heat transfer occurs between post 102 and cold plate 108.

Cold plate 108 also defines a fastener aperture 130. Fastener aperture 130 is laterally offset from post 102 and overlays panel 112. A fastener 132 extends through fastener aperture 130 between mounting flange 104 and panel 112, and couples post 102 to panel 112. Fastener aperture 130 has a width that is greater than fastener 132, thereby providing electrical separation between fastener 132 and cold plate 108. This allows fastener 132 to be seated directly in post 102, e.g., mounting flange 104, without the need to electrical isolation between fastener 132 and post 102. It is contemplated that fastener 132 compressively fix cold plate 108 between mounting flange 104 and panel 112, such as with a preload. This improves heat transfer across interfaces defines between components of mounting arrangement 100. It can also simplify mounting arrangement 100, allowing fastener 132 to fix cold plate 108 in registration with post 102 with directly engaging cold plate 108 with a separate fastener or layer of bonding material.

Electrically insulating body 106 overlays panel 112 and is disposed between mounting flange 104 and cold plate 108. Electrically insulating body 106 is formed from an electrically insulating material 141 with high thermal conductivity, such as aluminum nitride by way of non-limiting example. Fabricating electrically insulating body 106 from electrically insulating material 141 with high thermal conductivity provides both electrical isolation and thermal communication with between post 102 and cold plate 108. As shown in the exemplary embodiment illustrated in FIG. 3, electrically insulating body 106 can include two or more axially overlapping electrically insulating bodies, thereby providing sufficient electrical separation in applications where the potential difference between post 102 and cold plate 108 is relatively high using overlapping sheets of a standard thickness. This allows the arrangement to be customized according to the voltages present in the application, high-voltage direct current (HVDC) applications in aircraft electrical systems, e.g., between 200 and 300 volts, including a greater number of overlapping bodies than lower voltage applications. As also shown in the illustrated exemplary embodiment, electrically insulating body 106 extends laterally beyond mounting flange 104, increasing that contact area and rate of thermal communication between post 102 and cold plate 108.

Panel mounting structure 110 overlays panel 112, extends laterally from post 102, and is disposed axially between cold plate 108 and panel 112. Panel mounting structure 110 includes an electrically insulating material 140, such as a glass-reinforced epoxy laminate material. Examples of suitable materials include FR-4 and similar grades of flame retardant electrically isolating structures. In certain embodiments, electrically insulating material 140 defines a relatively thin sheet-like body, for example with a width of about 0.002 inches (500 microns), making mounting arrangement 100 relatively compact. In accordance with certain embodiments, electrically insulating material 140 can defines a relatively thick sheet-like body, for example with a width in the range of about 0.009 inches (2.3 millimeters) to about 0.015 inches (3.8 millimeters), thereby providing structural rigidity to mounting arrangement 100. Constructing panel mounting structure 100 from electrically insulting material 140 also allows for fastener 132 to be fixed therein, eliminating the need to fix fastener 132 with a nut and/or lock washer.

With reference to FIG. 4, an exemplary embodiment of a cold plate 108 for a three-phase electrical contactor assembly is shown. Cold plate 108 is arranged for fluid communication with an electrical panel liquid coolant circuit (not shown for reasons of clarity). In this respect coolant inlet 150 and coolant outlet 154 are disposed within a lug 170. Lug 170 is disposed on a side of cold plate 108, reducing the length of coolant conduit necessary to fluidly couple cold plate 108 with the panel assembly coolant circuit.

Cold plate 108 defines within its interior a coolant manifold 142 having a first lateral coolant channel 144, a mid-portion coolant channel 146, and a second lateral coolant channel 148. Coolant inlet 150 is in fluid communication with first lateral coolant channel 144, mid-portion coolant channel 146, and second lateral coolant channel 148 through an inlet header 152 for providing coolant flow to coolant manifold 142. Coolant outlet 154 is in fluid communication with first lateral coolant channel 144, mid-portion coolant channel 146, and second lateral coolant channel 148 through an outlet header 155 for receiving coolant from coolant manifold 142.

A plurality of source-side post apertures 156, 158, and 160 are defined by cold plate 108 between first lateral coolant channel 144 and mid-portion coolant channel 146. A first row of fastener apertures are defined between source-side post apertures 156, 158, and 160 and first lateral coolant channel 144. A second row of fastener apertures are defined between source-side post apertures 156, 158, and 160 and mid-portion coolant channel 146.

A plurality of supply-side post apertures 162, 164, and 166 are defined by cold plate 108 between second lateral coolant channel 148 and mid-portion coolant channel 146. A first row of fastener apertures are defined between source-side post apertures 156, 158, and 160 and first lateral coolant channel 144. A second row of fastener apertures are defined between source-side post apertures 156, 158, and 160 and mid-portion coolant channel 146.

The methods and systems of the present disclosure, as described above and shown in the drawings, provide for electrical contactor assemblies electrical panel assemblies with superior properties including reduced contactor operating temperature for a given current flow, increased current flow for a given rated operating temperature, and/or improved contactor reliability. While the apparatus and methods of the subject disclosure have been shown and described with reference to preferred embodiments, those skilled in the art will readily appreciate that changes and/or modifications may be made thereto without departing from the scope of the subject disclosure.

What is claimed is:

1. A mounting arrangement for an electrical contactor, comprising:
   a panel;
   a post having a first end and a second end protruding from the panel, the first end configured to connect to an electrical contactor, the second end configured to connect to an electrical bus bar; and
   a cold plate extending about the post and overlaying the panel, wherein the cold plate is in thermal communication with the post for transferring heat between the cold plate and the post,
   wherein the cold plate has an inlet, an outlet, and defines with its interior a coolant channel overlaying the panel, wherein the coolant channel is a first coolant channel, and wherein the cold plate defines a second coolant channel overlaying the panel.

2. The mounting arrangement as recited in claim 1, wherein the cold plate defines a post aperture, the post extending through the post aperture and being separated from the cold plate by the post aperture.

3. The mounting arrangement as recited in claim 1, wherein the cold plate defines a fastener aperture that is laterally offset from the post and overlaying the panel.

4. The mounting arrangement as recited in claim 3, further comprising a fastener, the fastener extending through the fastener aperture and coupling the post to the panel, the fastener aperture defining a gap between the fastener and the cold plate.

5. The mounting arrangement as recited in claim 1, wherein the cold plate comprises an electrically conductive material.

6. The mounting arrangement as recited in claim 1, wherein the first coolant channel and the second coolant channel are disposed on laterally opposite sides of the post.

7. The mounting arrangement as recited in claim 1, further comprising an electrically insulating body, the electrically insulating body overlaying the cold plate, electrically separating the cold plate from the post, and thermally coupling the cold plate with the post.

8. The mounting arrangement as recited in claim 7, wherein the electrically insulating body extends laterally beyond the post on both sides of the post.

9. The mounting arrangement as recited in claim 7, wherein the post has a mounting flange overlaying the electrically insulating body.

10. The mounting arrangement as recited in claim 1, further comprising a panel mounting structure, the panel mounting structure being disposed between the cold plate and the panel, the panel mounting structure extending laterally beyond the cold plate on opposite sides of the post.

11. The mounting arrangement as recited in claim 1, further comprising a contactor in electrical communication with the first end of the post.

12. The mounting arrangement as recited in claim 1, further comprising a bus bar connected to the second end or the post.

13. An electrical contactor assembly, comprising:
a panel;
a post having a first end and a second end protruding from the panel, the second end configured to connect to an electrical bus bar;
an electrical contactor in electrical communication with the first end of the post;
a cold plate extending about the post and overlaying the panel,
wherein the cold plate has an inlet and an outlet and defines with its interior and a plurality of coolant channel, wherein the first coolant channel overlays the panel,
wherein the second coolant channel overlays the panel of a side of the post laterally opposite the first coolant channel, and wherein the cold plate is in thermal communication the post for transferring heat between the post and the cold plate.

14. The contactor assembly as recited in claim 13, wherein the cold plate defines a post aperture, wherein the post extends through the post aperture and is separated from the cold plate by the post aperture.

15. The contactor assembly as recited in claim 13, wherein the cold plate defines a fastener aperture, wherein the fastener aperture is laterally offset from the post and overlays the panel.

16. The contactor assembly as recited in claim 13, further comprising a bus bar connected to the post, wherein the bus bar is disposed on a side of the panel opposite the cold plate.

17. An electrical panel assembly, comprising:
a panel;
a post having a first end and a second end protruding from the panel, the second end configured to connect to an electrical bus bar;
an electrical contactor in electrical communication with the first end of the post;
a bus bar connected to the post, wherein the bus bar is disposed on a side of the panel opposite the cold plate;
a cold plate extending about the post and overlaying the panel, wherein the cold plate is in thermal communication the post; and
an electrically insulating body, the electrically insulating body overlaying the cold plate, electrically separating the cold plate from the post, and thermally coupling the cold plate with the post,
wherein the cold plate has an inlet and an outlet and defines with its interior and a plurality of coolant channel, wherein the first coolant channel overlays the panel,
wherein the second coolant channel overlays the panel of a side of the post laterally opposite the first coolant channel, and wherein the cold plate is in thermal communication the post for transferring heat between the post and the cold plate.

* * * * *